(12) United States Patent
Lovenich et al.

(10) Patent No.: US 10,073,549 B2
(45) Date of Patent: Sep. 11, 2018

(54) PATTERNING OF A COMPOSITION COMPRISING SILVER NANOWIRES

(71) Applicant: Heraeus Deutschland GmbH & Co. KG, Hanau (DE)

(72) Inventors: Wilfried Lovenich, Bergisch-Gladbach (DE); Rüdiger Sauer, Leverkusen (DE); Udo Guntermann, Krefeld (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 0 days.

(21) Appl. No.: 14/905,160

(22) PCT Filed: Jul. 18, 2014

(86) PCT No.: PCT/EP2014/001963
§ 371 (c)(1),
(2) Date: Jan. 14, 2016

(87) PCT Pub. No.: WO2015/010778
PCT Pub. Date: Jan. 29, 2015

(65) Prior Publication Data
US 2016/0162063 A1    Jun. 9, 2016

(30) Foreign Application Priority Data
Jul. 22, 2013    (EP) .................................... 13003674

(51) Int. Cl.
*G06F 3/041* (2006.01)
*C09D 5/24* (2006.01)
(Continued)

(52) U.S. Cl.
CPC ............... *G06F 3/041* (2013.01); *B22F 7/04* (2013.01); *C09D 5/24* (2013.01); *G06F 3/044* (2013.01);
(Continued)

(58) Field of Classification Search
None
See application file for complete search history.

(56) References Cited

U.S. PATENT DOCUMENTS

2012/0031872 A1    2/2012    Sekiguchi et al.
2012/0104374 A1*   5/2012    Allemand ................ H01B 1/02
                                                          257/40
(Continued)

FOREIGN PATENT DOCUMENTS

| WO | WO-2011106438 A1 | 9/2011 |
| WO | WO-2012062446 A1 | 5/2012 |
| WO | WO-2013029028 A2 | 2/2013 |

OTHER PUBLICATIONS

International Search Report issued in PCT/EP2014/001963 dated Sep. 24, 2014.

*Primary Examiner* — Shamim Ahmed
(74) *Attorney, Agent, or Firm* — Blank Rome LLP

(57) ABSTRACT

The present invention relates to the production of a layer structure, comprising the following process steps:
i) coating a substrate with a composition at least comprising silver nanowires and a solvent;
ii) at least partial removal of the solvent, thereby obtaining a substrate that is coated with an electrically conductive layer, the electrically conductive layer at least comprising the silver nanowires;
iii) bringing into contact selected areas of the electrically conductive layer with an etching composition, thereby reducing the conductivity of the electrically conductive layer in these selected areas, wherein the etching composition comprises an organic compound capable of releasing chlorine, bromine or iodine, a compound containing hypochloride, a compound containing hypo-bromide or a mixture of at least two of these compounds.

(Continued)

Figure 1:
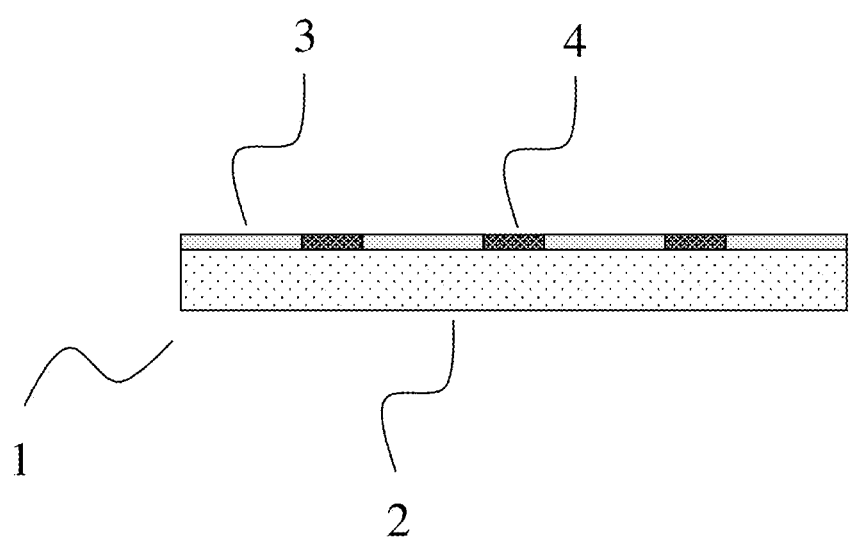

The invention also relates to a layer structure obtainable by this method, a layer structure, the use of a layer structure, an electronic component and the use of an organic compound.

20 Claims, 2 Drawing Sheets

(51) Int. Cl.
| | |
|---|---|
| H01L 51/00 | (2006.01) |
| H01L 51/10 | (2006.01) |
| H01L 51/44 | (2006.01) |
| H01L 51/52 | (2006.01) |
| H05K 9/00 | (2006.01) |
| H05K 3/06 | (2006.01) |
| B22F 7/04 | (2006.01) |
| G06F 3/044 | (2006.01) |
| B22F 1/00 | (2006.01) |
| H05K 1/09 | (2006.01) |
| B22F 3/24 | (2006.01) |

(52) U.S. Cl.
CPC ........ *H01L 51/0023* (2013.01); *H01L 51/102* (2013.01); *H01L 51/442* (2013.01); *H01L 51/5215* (2013.01); *H01L 51/5234* (2013.01); *H05K 3/067* (2013.01); *H05K 9/0096* (2013.01); *B22F 1/0025* (2013.01); *B22F 2003/244* (2013.01); *B22F 2301/255* (2013.01); *G06F 2203/04103* (2013.01); *G06F 2203/04112* (2013.01); *H05K 1/097* (2013.01); *H05K 2201/026* (2013.01); *H05K 2203/0789* (2013.01); *Y02E 10/549* (2013.01); *Y02P 70/521* (2015.11)

(56) References Cited

U.S. PATENT DOCUMENTS

2013/0160608 A1* 6/2013 Nusko .................. B22F 1/0025
75/370
2013/0295354 A1* 11/2013 Guntermann .......... H01B 1/127
428/212

* cited by examiner

PATTERNING OF A COMPOSITION COMPRISING SILVER NANOWIRES

This application is the national stage of International Patent Application No. PCT/EP2014/001963, filed Jul. 18, 2014, which claims the benefit of European Patent Application No. 13003674.2, filed Jul. 22, 2013, which is hereby incorporated by reference in its entirety.

The present invention relates to a method for producing a layer structure, a layer structure obtainable by this method, a layer structure, the use of a layer structure, an electronic component and the use of an organic compound.

The production of metal nanowires and in particular silver nanowires via the polyol process is well known and, for example, disclosed in DE-A-10 2010 017706, U.S. Pat. No. 7,585,349 and WO-A-2008/073143. A Polyol is used as solvent and as a reduction agent for silver salts, most prominently silver nitrate, whilst a dispersion agent such as polyvinylpyrrolidone and a halide are present. The components are chosen in such a manner that anisotropic wires are formed with an aspect ratio of 10:1 up to 1000:1 or more.

The deposition of the silver nanowires onto a substrate leads to electrically conductive films with low sheet resistance and high transparency. These can be deposited on glass as well as flexible substrates. Hence, silver nanowires are an alternative to established transparent conductors such as ITO (=indium tin oxide layers).

There is a great need to be able to pattern electrically conductive layers (including those based on silver nanowires) in a similar way to ITO layers, "patterning" referring here and hereafter to any measure which in a sub-area or in multiple subareas of the electrically conductive layers leads to an at least partial reduction and preferably to a complete elimination of the conductivity.

One possibility for producing patterned layers based on silver nanowires is to apply these structures onto a surface in a patterned way by means of certain printing methods. In addition to the use of printing pastes, another possibility for producing patterned coatings from silver nanowires is first to produce a uniform, unpatterned coating of silver nanowires and to pattern it subsequently by washing the coated substrate with water, thereby removing silver nanowires from the respective areas. As a result, a patterned structure is obtained which in some areas are coated with silver nanowires and which in some areas is free of any coating. As the silver nanowire coating has in influence on the optical properties, removal of this coating in certain areas leads to inhomogeneous optical properties within the patterned structure, which in most applications, such as in touch screens, is not desirable.

WO-A-2011/106438 describes a process for the deposition and structuring of silver nanowires. Silver nanowires are deposited from an aqueous dispersion and the resulting layers can subsequently be etched using and etching solution that comprises a halide, such as chloride or iodide, and an oxidizer, such as $FeCl_3$, $CuCl_2$, $HNO_3$, $H_2O_2$ or $O_2$. The etching solutions used in the Examples of WO-A-2011/106438 further comprised oxidizing agents such as $KMnO_4$. The resulting etched film shows an increase in sheet resistances compared to the non-etched areas with little or no change in sheet resistance. The disadvantage of this process, however, is that the etching substances such as $FeCl_3$, $CuCl_2$, $HNO_3$, $H_2O_2$ or $KMnO_4$ critically compromise the colour of the coating, which has an adverse influence on the external appearance of the coating.

US-A-2012/0104374 describes compositions containing PEDOT:PSS and silver nanowires that can be used for the preparation of highly transparent and highly conductive films. The presence of a polymer leads to the smoothing of the resulting films. However, no structuring method is available for such mixtures.

The object of the present invention was to overcome the disadvantages arising from the prior art in connection with the patterning of electrically conductive layers based on silver nanowires.

In particular, the object of the present invention was to provide a method for patterning electrically conductive layers based on silver nanowires, in which—compared to the concepts known from the prior art—significant differences in the sheet resistance can be achieved between etched and non-etched areas without effecting the optical appearance of the patterning. In particular, the process should allow the production of transparent and structured electrically conductive layers, in which some areas (i. e. the non-etched areas) are characterized by a surface resistance of preferably not more than 250 Ω/square, and in which other areas (i. e. the etched areas) are characterized by a surface resistance of at least $1 \times 10^6$ Ω/square and wherein the colour difference between these areas is as low as possible.

A contribution to achieving these objects is made by a method for producing a layer structure, comprising the process steps:

i) coating a substrate with a composition at least comprising silver nanowires and a solvent;

ii) at least partial removal of the solvent, thereby obtaining a substrate that is coated with an electrically conductive layer, the electrically conductive layer at least comprising the silver nanowires;

iii) bringing into contact selected areas of the electrically conductive layer with an etching composition, thereby reducing the conductivity of the electrically conductive layer in these selected areas, wherein the etching composition comprises an organic compound capable of releasing chlorine, bromine or iodine, a compound containing hypochloride, a compound containing hypobromide or a mixture of at least two of these compounds.

Completely surprisingly, but no less advantageously for that, it was found that if a coating that comprises silver nanowires is etched with an organic compound capable of releasing chlorine, bromine or iodine, a compound containing hypochloride, a compound containing hypobromide or a mixture of at least two of these compounds, a patterned structure can be obtained that is not only characterized by a significant difference in the surface resistance between the etched and the non-etched surfaces, but also by a very homogeneous optical appearance.

In process step i) a substrate is coated with a composition at least comprising silver nanowires and a solvent.

The wording "coating a substrate with a composition at least comprising silver nanowires and a solvent" encompasses both a process step in which the composition is applied directly onto the substrate and also process steps in which the composition is applied to an interlayer that may be coated onto the substrate.

Plastic films in particular are preferred as the substrate in this connection, most particularly preferably transparent plastic films, which conventionally have a thickness in a range from 5 to 5000 μm, particularly preferably in a range from 10 to 2500 μm and most preferably in a range from 25 to 1000 μm. Such plastic films can be based, for example, on polymers such as polycarbonates, polyesters such as for example PET and PEN (polyethylene terephthalate and polyethylene naphthalene dicarboxylate), copolycarbonates, polysulphones, polyether sulphones (PES), polyimides, polyamides, polyethylene, polypropylene or cyclic polyolefins or cyclic olefin copolymers (COC), polyvinyl chloride, polystyrene, hydrogenated styrene polymers or hydrogenated styrene copolymers. In addition to plastic materials, substrates based in particular on metals or metal oxides are also suitable as substrates, such as for example ITO layers (indium tin oxide layers) or the like. Glass is also preferred as a substrate.

This substrate is coated with a composition at least comprising silver nanowires and a solvent. The surface of the substrates can be pre-treated prior to applying the composition, for example by treatment with a primer, by corona treatment, flame treatment, fluorination or plasma treatment, to improve the polarity of the surface and hence the wettability and chemical affinity.

Preferred silver nanowires in the composition used in process step i) have a length of from 1 µm to 200 µm, a diameter of from 20 nm to 1300 nm and an aspect ratio (length/diameter) of at least 5.

The silver nanowires in the composition used in process step i) can be prepared by known methods in the art. In particular, silver nanowires can be synthesized through solution-phase reduction of a silver salt (e.g., silver nitrate) in the presence of a polyol (e.g., ethylene glycol) and poly(vinyl pyrrolidone). Large-scale production of silver nanowires of uniform size can be prepared according to the methods described in e.g., Xia, Y. et al., Chem. Mater. (2002), 14, 4736-4745, and Xia, Y. et al., Nanoletters (2003) 3(7), 955-960.

According to a preferred embodiment of the silver nanowires used in process step i) these nanowires are produced with the process disclosed in DE-A-10 2010 017 706. This process comprises the steps:
a) provision of a reaction mixture comprising
   a polyol,
   an organic chemical which is adsorbed on to a silver surface,
   a chemical which forms a halide and/or one which forms a pseudohalide, wherein the chemical which forms a halide is a salt of one of the halides $Cl^-$, $Br^-$ and/or $I^-$ and wherein the chemical which forms a pseudohalide is a salt of one of the pseudohalides $SCN^-$, $CN^-$, $OCN^-$ and/or $CNO^-$,
   a chemical which forms a redox pair, chosen from the group consisting of bromine, iodine, vanadium and mixtures thereof, and
   a silver salt, preferably in an amount of at least 0.5 wt. %, based on the total weight of the reaction mixture,
b) heating of the reaction mixture to a temperature of at least 100° C. for the duration of the reaction.

Preferred embodiments of this process for the production of silver nanowires are those embodiments which in DE-A-10 2010 017 706 are described as preferred embodiments. In this context, it is particularly preferred that
   the polyol is preferably selected from the group consisting of ethylene glycol, tetraethylene glycol, 1,2-propanediol, dipropylene glycol, 1,2-butanediol, 1,3-butanediol, 1,4-butanediol and 2,3-butanediol;
   the organic chemical which is adsorbed on to a silver surface is preferably selected from the group consisting of polyvinylpyrrolidone (PVP), polyvinyl alcohol (PVA) and of various grades (molecular weights) and copolymers of these polymers.

According to a preferred embodiment of the process according to the present invention the composition used in process step i) further comprises a sulphonated polymer.

The sulfonated polymers in the composition used in process step i) can be any polymer that comprises sulfonic acid groups or sulfonate groups. Preferred sulfonated polymers comprise sulphonated polyether ether ketones (sPEEK), preferably those disclosed in WO-A-2011/113612, or polymers having a polyalkylene-backbone and bearing sulfonic acid groups or sulfonate groups.

Preferred polymers having a polyalkylene-backbone and bearing sulfonic acid groups or sulfonate groups can be obtained by sulfonation of polymers having a polyalkylene-backbone, such as polystyrene, or by polymerisation of ethylenically unsaturated monomers bearing sulfonic acid groups (or salts thereof), optionally together with ethylenically unsaturated monomers that do not bear a sulfonic acid groups (or sulfonate groups). Examples of ethylenically unsaturated monomers bearing a sulfonic acid group or a sulfonate group are substituted or unsubstituted ethylenesulfonic acid compounds such as vinylsulfonic acid, vinylsulfonic acid salt, allylsulfonic acid, allylsulfonic acid salt, methallylsulfonic acid, methallylsulfonic acid salt, 4-sulfobutyl methacrylate, 4-sulfobutyl methacrylate salt, methallyloxybenzenesulfonic acid, methallyloxybenzenesulfonic acid salt, allyloxybenzenesulfonic acid and allyloxybenzenesulfonic acid salt, substituted or unsubstituted styrenesulfonic acid compounds such as styrenesulfonic acid, styrenesulfonic acid salt, -methylstyrenesulfonic acid and methylstyrenesulfonic acid salt, substituted acrylamidesulfonic acid compounds such as acrylamide-t-butylsulfonic acid, acrylamide-t-butylsulfonic acid salt, 2-acrylamide-2-methylpropanesulfonic acid and 2-acrylamide-2-methylpropane-sulfonic acid salt, substituted or unsubstituted cyclovinylenesulfonic acid compounds such as cyclobutene-3-sulfonic acid and cyclobutene-3-sulfonic acid salt and substituted or unsubstituted butadienesulfonic acid compounds such as isoprenesulfonic acid, isoprenesulfonic acid salt, 1,3-butadiene-1-sulfonic acid, 1,3-butadiene-1-sulfonic acid salt, 1-methyl-1,3-butadiene-2-sulfonic acid, 1-methyl-1,3-butadiene-3-sulfonic acid salt, 1-methyl-1,3-butadiene-4-sulfonic acid and 1-methyl-1,3-butadiene-4-sulfonic acid salt.

These monomers bearing a sulfonic acid group or a sulfonate group can, for example, be copolymerized with monomers such as ethylene, propene, 1-butene, 2-butene, 1-pentene, 2-pentene, 1-hexene, 2-hexene, styrene, p-methylstyrene, p-ethylstyrene, p-butylstyrene, 2,4,6-trimethylstyrene, p-methoxystyrene, 2-vinylnaphthalene, 6-methyl-2-vinyl-naphthalene, 1-vinylimidazole, vinylpyridine, vinyl acetate, acrylaldehyde, acrylonitrile, N-vinyl-2-pyrrolidone, acrylamide, N,N-dimethylacrylamide, methyl acrylate, ethyl acrylate, propyl acrylate, butyl acrylate, isobutyl acrylate, isooctyl acrylate, isononylbutyl acrylate, allyl acrylate, ethyl methacrylate, hydroxyethyl acrylate, methoxyethyl acrylate, methoxybutyl acrylate, stearyl acrylate, acrylic acid ester, acryloyl morpholine, vinylamine, N,N-dimethylvinylamine, N,N-diethylvinylamine, N,N-dibutylvinylamine, N,N-di-t-butylvinylamine, N,N-diphenylvinylamine, N-vinyl carbazole, vinyl alcohol, vinyl chloride, vinyl fluoride, vinyl ether, cyclopropene, cyclobutene, cyclopentene, cyclohexene, cycloheptene, cyclooctene, 2-methylcyclohexene, vinylphenol, 1,3-butadiene, 1-methyl-1,3-butadiene, 2-methyl-1,3-butadiene, 1,4-dimethyl-1,3-butadiene, 1,2-dimethyl-1,3-butadiene, 1,3-dimethyl-1,3-butadiene, 1-octyl-1,3-butadiene, 2-octyl-1,3-butadiene, 1-phenyl-1,3-butadiene, 2-phenyl-1,3-butadiene, 1-hydroxy-1,3-butadiene, 2-hydroxy-1,3-butadiene, allyl acrylate, acrylamideallyl, divinyl ether, o-divinylbenzene, m-divinylbenzene and p-divinylbenzene.

Particularly preferred sulfonated polymers are polystyrenesulfonic acid (PSS) as well as copolymers of styrene and styrenesulfonic acid with a sulfonation degree of at least 50%, preferably at least 75% and even more preferred at least 100%, wherein the use of polystyrenesulfonic acid is mostly preferred.

The molecular weight ($M_w$) of the sulfonated polymer, preferably polystyrenesulfonic acid, is preferably 1000 to 2000000, particularly preferably 2000 to 500000. The molecular weight is determined by gel permeation chromatography using polystyrene sulphonic acids of defined molecular weights as the calibration standard. The polyacids or alkali salts thereof are available commercially, for example polystyrene sulphonic acids and polyacrylic acids, or can be produced by known methods (see for example Houben Weyl, Methoden der organischen Chemie, Vol. E 20 Makromolekulare Stoffe, Part 2, (1987), p. 1141 ff.).

The weight ratio of silver nanowires to sulfonated polymer (silver nanowire:sulfonated polymer) in the composition used in process step i) is preferably in the range from 50:1 to 1:50, more preferably in the range from 25:1 to 1:25 and most preferably in the range from 10:1 to 1:10. The concentration of the sulfonate polymer in the composition that is used in process step i) is preferably in the range from 0.1 to 10 wt.-%, more preferably in the range from 0.2 to 4 wt.-%.

The solvent in the composition used in process step i) can be water, an organic solvent such as methanol, ethanol, 1-propanol or 2-propanol, or a mixture or water and one of these organic solvents, wherein the use of water as a solvent is particularly preferred. The composition used in process step i) may also comprise a certain residue of solvents that have been used for the preparation of the silver nanowires.

According to a particularly preferred embodiment of the process according to the present invention the composition used in process step i) not only comprises a sulphonated polymer as a further component, but also a conductive polymer such as a polythiophene, a polypyrrole or a polyaniline, wherein a polythiophene is particularly preferred.

Preferred polythiophenes are those of the formula (I)

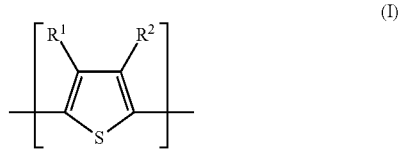

(I)

in which
$R^1$ and $R^2$ independently of each other each denote H, an optionally substituted $C_1$-$C_{18}$ alkyl radical or an optionally substituted $C_1$-$C_{18}$ alkoxy radical, $R_1$ and $R_2$ together denote an optionally substituted $C_1$-$C_8$ alkylene radical, wherein one or more C atoms can be replaced by one or more identical or different heteroatoms selected from O or S, preferably a $C_1$-$C_8$ dioxyalkylene radical, an optionally substituted $C_1$-$C_8$ oxythiaalkylene radical or an optionally substituted $C_1$-$C_8$ dithiaalkylene radical, or an optionally substituted $C_1$-$C_8$ alkylidene radical, wherein optionally at least one C atom is replaced by a heteroatom selected from O or S.

In a particularly preferred embodiment of the method according to the invention polythiophenes are preferred which comprise repeating units of the general formula (I-a) and/or the general formula (I-b):

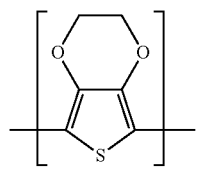

(I-a)

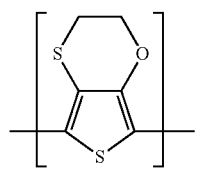

(I-b)

In the context of the invention the prefix "poly" is understood to mean that more than one identical or different repeating unit is comprised in the polythiophene. The polythiophenes comprise in total n repeating units of the general formula (I), wherein n can be a whole number from 2 to 2000, preferably 2 to 100. The repeating units of the general formula (I) within a polythiophene can in each case be identical or different. Polythiophenes comprising in each case identical repeating units of the general formula (I) are preferred.

The polythiophenes preferably each bear H at the end groups.

In particularly preferred embodiments the polythiophene is poly(3,4-ethylene-dioxythiophene) (PEDOT), poly(3,4-ethyleneoxythiathiophene) or poly(thieno-[3,4-b]thiophene, whereby poly(3,4-ethylenedioxythiophene) is most preferred.

The polythiophenes are preferably cationic, wherein "cationic" relates only to the charges located on the polythiophene main chain. Depending on the substituent at the radicals $R^1$ and $R^2$, the polythiophenes can bear positive and negative charges in the structural unit, the positive charges being located on the polythiophene main chain and the negative charges optionally at the radicals R substituted with sulphonate or carboxylate groups.

The positive charges of the polythiophene main chain can be partially or completely saturated by the optionally present anionic groups at the radicals $R^1$ and $R^2$. Considered as a whole, the polythiophenes can be cationic, neutral or even anionic in these cases. Nevertheless, in the context of the invention they are all considered as cationic polythiophenes, since the positive charges on the polythiophene main chain are decisive. The positive charges are not represented in the formulae because they are mesomerically delocalised. However, the number of positive charges is at least 1 and at most n, where n is the total number of all repeating units (identical or different) within the polythiophene.

It is, however, particularly preferable according to the present invention for the positive charges on the polythiophene main chain to be compensated by the sulfonate groups of the sulfonated polymer. In this context it is particularly preferred that the conductive polymer is present in the form of a complex formed from the polythiophene and the sulfonated polymer, wherein it is most preferred that the conductive polymer is poly(3,4-ethylenedioxythiophene) (PEDOT), that the sulfonated polymer is polystyrenesulfonic acid and that these components are present in the form of a PEDOT/PSS-complex. Such a PEDOT/PSS-complex can, for example, be obtained by oxidatively polymerizing 3,4-ethyenedioxythiophene in the presence of polystyrenesulfonic acid, as described in detail in chapter 9 of Elschner et al.: "PEDOT Principles and Applications of an Intrinsically Conductive Polymer", CRC Press (2011).

The weight ratio of polythiophene to the sulfonated polymer, preferably the weight ratio of PEDOT to PSS (PEDOT:PSS), in these complexes is preferably in a range from 1:0.3 to 1:100, preferably in a range from 1:1 to 1:40, particularly preferably in a range from 1:2 to 1:20 and extremely preferably in a range from 1:2 to 1:15.

The composition used in process step i) may further comprise additives. Suitable additives are, for example, compounds which raise the conductivity, such as for example ether group-comprising compounds such as for example tetrahydrofuran, lactone group-comprising compounds such as butyrolactone, valerolactone, amide group- or lactam group-comprising compounds such as caprolactam, N-methyl caprolactam, N,N-dimethyl acetamide, N-methyl acetamide, N,N-dimethyl formamide (DMF), N-methyl formamide, N-methyl formanilide, N-methyl pyrrolidone (NMP), N-octyl pyrrolidone, pyrrolidone, sulphones and sulphoxides, such as for example sulpholane (tetramethylene sulphone), dimethyl sulphoxide (DMSO), sugar or sugar derivatives, such as for example sucrose, glucose, fructose, lactose, sugar alcohols such as for example sorbitol, mannitol, furan derivatives such as for example 2-furan carboxylic acid, 3-furan carboxylic acid, and/or di- or polyalcohols such as for example ethylene glycol, glycerol or di- or triethylene glycol. Tetrahydrofuran, N-methyl formamide, N-methyl pyrrolidone, ethylene glycol, dimethyl sulphoxide or sorbitol are particularly preferably used as conductivity-raising additives.

One or more binders, such as polyvinyl acetate, polycarbonate, polyvinyl butyral, polyacrylic acid esters, polyacrylic acid amides, polymethacrylic acid esters, polymethacrylic acid amides, polystyrene, polyacrylonitrile, polyvinyl chloride, polyvinyl pyrrolidones, polybutadiene, polyisoprene, polyethers, polyesters, polyurethanes, polyamides, polyimides, polysulphones, silicones, epoxy resins, styrene/acrylate copolymers, vinyl acetate/acrylate copolymers and ethylene/vinyl acetate copolymers, polyvinyl alcohols or celluloses, can also be added as an additive to the composition. The proportion of the polymeric binder, if used, is conventionally in a range from 0.1 to 90 wt.-%, preferably 0.5 to 30 wt.-% and most particularly preferably 0.5 to 10 wt.-%, relative to the total weight of the composition.

Bases or acids, for example, can be added as an additive to the compositions to adjust the pH. In this context compounds which do not adversely affect the film forming of the dispersions are preferred, such as for example the bases 2-(dimethylamino)ethanol, 2,2'-iminodiethanol or 2,2',2"-nitrilotriethanol.

Furthermore, surface-active agents, such as anionic surfactants, e.g. alkylphenylsulphonic acids and salts, paraffinsulphonates, alcoholsulphonates, ethersulphonates, sulphosuccinates, phosphateesters, alkylethercarboxylic acids or carboxylates, cationic surfactants, e.g. quaternary alkylammonium salts, non-ionic surfactants, e.g. linear alcohol ethoxylates, oxoalcoholethoxylates, alkylphenolethoxylate or alkylpolyglucosides may be used as additives.

The composition that is used in process step i) of the preferred embodiment of the process according to the present invention (i. e. the embodiment in which the composition that is used in process step i) further comprises a sulphonated polymer) can be obtained by simply mixing together the silver nanowires, preferably in the form of a dispersion obtained by the process disclosed in DE-A10 2010 017 706, with the sulfonated polymer, which can also be present in the form of a solution or dispersion. If the sulfonated polymer is applied in the form of a complex with an electrically conductive polymer as described above, the composition that is used in process step i) can be obtained by simply mixing together a dispersion comprising the silver nanowires and a dispersion comprising these complexes, preferably a PEDOT/PSS-dispersion such as Clevios PH 1000.

The composition used in process step i) can be applied to the substrate by known methods, for example by spin coating, dipping, pouring, dropping on, injecting, spraying, knife application, spreading or printing, for example inkjet, screen, intaglio, offset or pad printing, in a wet film thickness of 0.5 μm to 250 μm, preferably in a wet film thickness of 2 μm to 50 μm.

In process step ii) of the process according to the present invention at least part of the solvent is removed, thereby obtaining a substrate that is coated with an electrically conductive layer, the electrically conductive layer at least comprising the silver nanowires and—if the composition used in process step i) further comprises a sulfonated polymer—the sulphonated polymer, said removal preferably being performed by simple evaporation.

The thickness of the electrically conductive layer obtained in process step ii) is preferably 1 nm to 50 μm, particularly preferably in a range from 1 nm to 5 μm and most preferably in a range from 10 nm to 500 nm In process step iii) of the of the process according to the present invention selected areas of the electrically conductive layer are brought into contact with an etching composition, thereby reducing the conductivity of the electrically conductive layer in these selected areas.

According to a preferred embodiment of the process according to the present invention the etching composition comprises an organic compound capable of releasing chlorine, bromine or iodine, a compound containing hypochloride, such as sodium hypochloride or potassium hypochloride, a compound containing hypobromide, such as sodium hypobromide or potassium hypobromide, or a mixture of at least two of these compounds. These compounds are subsequently called "etching compounds".

The formulation "which is capable of releasing chlorine, bromine or iodine" is preferably understood according to the present invention as meaning an on organic compound, which, after addition of a solvent, preferably after addition of water, releases chlorine in the form of $Cl_2$, HOCl, $OCl^-$ or a mixture of at least two of these chlorine compounds, or bromine in the form of $Br_2$, HOBr, $OBr^-$ or a mixture of at least two of these bromine compounds, or iodine in the form of $I_2$, HIO, $IO^-$ or a mixture of at least two of these iodine compounds.

An organic compound capable of releasing chlorine, bromine or iodine that is particularly preferred according to the invention is an organic compound comprising at least one structural element (II)

in which
Hal is a halogen selected from the group consisting of chlorine, bromine or iodine, but preferably denotes chlorine or bromine,
Y is selected from N, S and P, but preferably denotes N, and
$X_1$ and $X_2$ can be the same or different and each denote a halogen, preferably chlorine or bromine, a carbon atom or a sulphur atom, wherein one or more further atoms can optionally be bonded to $X_1$ and $X_2$. The number of further atoms bonded to $X_1$ and $X_2$ is dependent on the covalence of $X_1$ and $X_2$.

According to a first particular embodiment of the method according to the invention the organic compound capable of releasing chlorine or bromine comprises at least two structural elements (III) in which Hal denotes a chlorine atom or a bromine atom and Y denotes nitrogen, wherein these at least two structural elements (III) can optionally also be different from one another. In this connection it is most particularly preferable according to a first variant of the method for the organic compound capable of releasing chlorine or bromine to comprise the structural element (III)

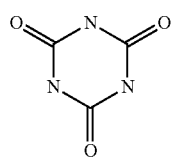

(III)

in which a chlorine atom or a bromine atom is bonded to at least two of the nitrogen atoms. Of these organic compounds, sodium dichlorodiisocyanurate, sodium dibromodiisocyanurate, tribromoisocyanuric acid and trichloroisocyanuric acid are particularly preferred.

According to a second method variant of this first particular embodiment of the method according to the invention it is preferable for the organic compound capable of releasing chlorine or bromine to comprise the structural element (IV)

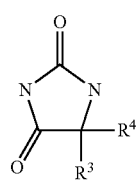

(IV)

in which a chlorine atom or a bromine atom is bonded to the two nitrogen atoms and in which $R^3$ and $R^4$ can be the same or different and denote a hydrogen atom or a $C_1$-$C_4$ alkyl group, in particular a methyl group or an ethyl group.

In this connection particularly preferred organic compounds capable of releasing chlorine or bromine are selected from the group consisting of bromo-3-chloro-5,5-dimethylhydantoin, 1-chloro-3-bromo-5,5-dimethylhydantoin, 1,3-dichloro-5,5-dimethylhydantoin and 1,3-dibromo-5,5-dimethylhydantoin.

According to a second particular embodiment of the method according to the invention the organic compound capable of releasing chlorine or bromine comprises exactly one structural element (II). In this case too Y preferably denotes N.

According to a first method variant of this second particular embodiment of the method according to the invention the organic compound capable of releasing chlorine or bromine is N-chlorosuccinimide or N-bromosuccinimide.

According to a second method variant of this second particular embodiment of the method according to the invention the organic compound capable of releasing chlorine or bromine comprises the structural element (V)

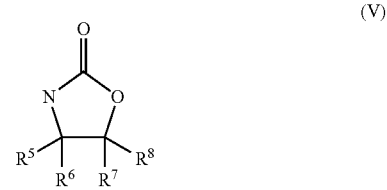

(V)

in which a chlorine atom or a bromine atom is bonded to the nitrogen atom and in which $R^5$, $R^6$, $R^7$ and $R^8$ can be the same or different and denote a hydrogen atom or a $C_1$-$C_4$ alkyl group, which can optionally be substituted with bromine or chlorine. In this connection 3-bromo-5-chloromethyl-2-oxazolidinone, 3-chloro-5-chloromethyl-2-oxazolidinone, 3-bromo-5-bromomethyl-2-oxazolidinone and 3-chloro-5-bromomethyl-2-oxazolidinone can be cited as examples of suitable organic compounds.

Furthermore, the organic compound capable of releasing chlorine or bromine according to the second particular embodiment of the method according to the invention can for example be halazone, an N,N-dichlorosulphonamide, an N-chloro-N-alkylsulphonamide or an N-bromo-N-alkylsulphonamide in which the alkyl group is a $C_1$-$C_4$ alkyl group, particularly preferably a methyl group or an ethyl group.

Also suitable as the organic etching compound capable of releasing chlorine, bromine or iodine according to a third particular embodiment of the method according to the invention are organic compounds selected from the group consisting of 5-chloro-2-methyl-4-isothiazolin-3-one, 4,5-dichloro-2-N-octyl-4-isothia-zolin-3-one, bromo-2-nitro-1, 3-propanediol (BNPD), 2,2-dibromo-3-nitrilopropionamide, dibromonitroethyl propionate, dibromonitroethyl formate, sodium-N-chloro-(4-methylbenzene)sulphonamide or tetraglycine hydroperiodide.

The etching composition used in process step iii) is preferably an aqueous solution or dispersion in which the etching compound is dissolved or dispersed. In this connection it is particularly preferable for the aqueous solution or dispersion to have a pH determined at 25° C. in the range from 1 to 12.

The etching composition, particularly preferably the aqueous solution or dispercion, preferably comprises the etching compound in a concentration in a range from 0.1 to 50 wt.-%, particularly preferably in a range from 0.5 to 35 wt.-% and most preferably in a range from 1 to 20 wt.-%, relative in each case to the total weight of the etching composition.

The bringing into contact of the electrically conductive layer with the etching composition in process step iii) preferably takes place by dipping the electrically conductive layer into the etching composition or by printing the electrically conductive layer with the etching composition. To ensure an adequate patterning, the electrically conductive layer remains in contact with the etching composition, preferably the aqueous solution or dispersion, for approximately 1 second to 30 minutes, particularly preferably for approximately 30 seconds to 15 minutes and most preferably approximately 1 to 5 minutes, before it is withdrawn again or before the etching composition is removed again. The temperature of the etching composition during the bringing into contact with the electrically conductive layer is preferably in a range from 10 to 40° C., particularly preferably in a range from 20 to 30° C., whereby the use of an etching composition at room temperature (25° C.) is most preferred.

Various methods are suitable for bringing only a part of the electrically conductive layer of the layer structure into contact with the etching composition for the purpose of patterning. In the simplest case a patterning can be achieved by dipping only a part of the layer structure into the etching composition and correspondingly also bringing only a part of the electrically conductive layer into contact with the etching composition. It is, however, also conceivable for the etching composition to be applied by, for example, printing on only certain areas of the electrically conductive layer on the layer structure. The use of templates with which the layer structures can be covered and which have cut-outs through which the etching composition can come into contact with certain areas of the electrically conductive layer is also conceivable. It is moreover also possible to use photolithography to bring about a patterning.

The method according to the invention can comprise as a further process step:

iv) washing the electrically conductive layer brought into contact with the etching composition, wherein washing preferably takes place by dipping the layer structure into a solvent, for example water, and this can be followed by a drying step.

In the method according to the invention it is furthermore preferable for the bringing into contact of the electrically conductive layer with the etching composition to take place under conditions such that the diameter of the silver nano wires in the electrically conductive layer in the areas brought into contact with the etching composition is reduced by at most 50%, particularly preferably by at most 25% and most preferably by at most 10%.

A contribution to achieving the objects set out in the introduction is also made by a layer structure obtainable by the method according to the present invention described above.

A contribution to achieving the objects set out in the introduction is also made by a layer structure comprising a substrate and an electrically conductive layer on top the substrate, wherein the electrically conductive layer at least comprises silver nanowires, wherein the layer structure comprises A) at least one area A in which the electrically conductive layer on top of the substrate has a surface resistance R;

B) at least one area B in which the electrically conductive layer on the substrate has a surface resistance which at least 10 times, preferably at least 100 times, still more preferably at least 1000 times, still more preferably at least 10,000 times and most preferably at least 100,000 times greater than R, wherein the colour difference $\Delta E_{area\ A,\ area\ B}$ is at most 4.5, particularly preferably at most 3.0 and most preferably at most 1.5. The colour difference $\Delta E_{area\ A,\ area\ B}$ is calculated as follows:

$$\Delta E_{area\ A, area\ B} = \sqrt{(L^*_{area\ A} - L^*_{area\ B})^2 + (a^*_{area\ A} - a^*_{area\ B})^2 + (b^*_{area\ A} - b^*_{area\ B})^2}$$

$L^*_{area\ A}$, $a^*_{area\ A}$ and $b^*_{area\ A}$ are the L, a and b values respectively of the L*a*b* colour space of areas A and $L^*_{area\ B}$, $a^*_{area\ B}$ and $b^*_{area\ B}$ are the L, a and b values respectively of the L*a*b* colour space of areas B.

Preferred substrates and silver nanowires are those substrates and silver nanowires that have already been mentioned in connection with the above described process according to the present invention. The thickness of the electrically conductive layer also preferably corresponds to the thickness of the electrically conductive layer described above as the preferred film thickness in connection with the method according to the invention.

According to a preferred embodiment of the layer structure according to the present invention the electrically conductive layer further comprises a sulphonated polymer, wherein those sulphonated polymer are preferred that have already been mentioned in connection with the above described process according to the present invention. Furthermore, the electrically conductive layer in the layer structure according to the present invention may further comprise an electrically conductive polymer, preferably poly(3,4-ethylenedioxythiophene), which—as described above in connection with the process according to the present invention—preferably is present in the form of a complex with the sulfonated polymer, preferably in the form of a PEDOT/PSS-complex.

It is furthermore preferable in connection with the layer structure according to the invention for the areas A and B to have a geometric shape, preferably a geometric shape selected from the group consisting of a circle, a rectangle or a triangle. In this connection it is particularly preferable for the areas A and B together to form a circuit design. In this connection it is furthermore preferable for the areas A and B each to have a surface area of at least 0.00001 mm$^2$, preferably at least 0.0001 mm$^2$, still more preferably at least 0.001 mm$^2$, still more preferably at least 0.01 mm$^2$, still more preferably at least 0.1 mm$^2$, still more preferably at least 1 mm$^2$ and most preferably at least 10 mm$^2$.

A contribution to achieving the objects set out in the introduction is also made by the use of a layer structure obtainable by the method according to the invention or of a layer structure according to the invention to produce electronic components, in particular organic light-emitting diodes, organic solar cells or capacitors, to produce touch panels or touch screens or to produce an antistatic coating.

A contribution to achieving the objects set out in the introduction is also made by electronic components, such as organic light-emitting diodes, organic solar cells or capacitors or by a touch panel or a touch screen comprising a layer structure obtainable by the method according to the invention or a layer structure according to the invention.

A contribution to achieving the objects set out in the introduction is also made by the use of an organic compound capable of releasing chlorine, bromine or iodine, of a compound containing hypochloride, of a compound containing hypobromide or of a mixture at least two of these compounds to treat an electrically conductive layer at least comprising silver nanowires, preferably at least comprising silver nanowires and a sulphonated polymer, more preferably at least comprising silver nanowires and a PEDOT/PSS-complex. The organic compounds already mentioned above as preferred organic compounds in connection with the method according to the invention are preferred as the organic compound capable of releasing chlorine, bromine or iodine, as the compound containing hypochloride or as the compound containing hypobromide.

The invention is now described in more detail by reference to figures, test methods and non-limiting examples.

Figure 2:
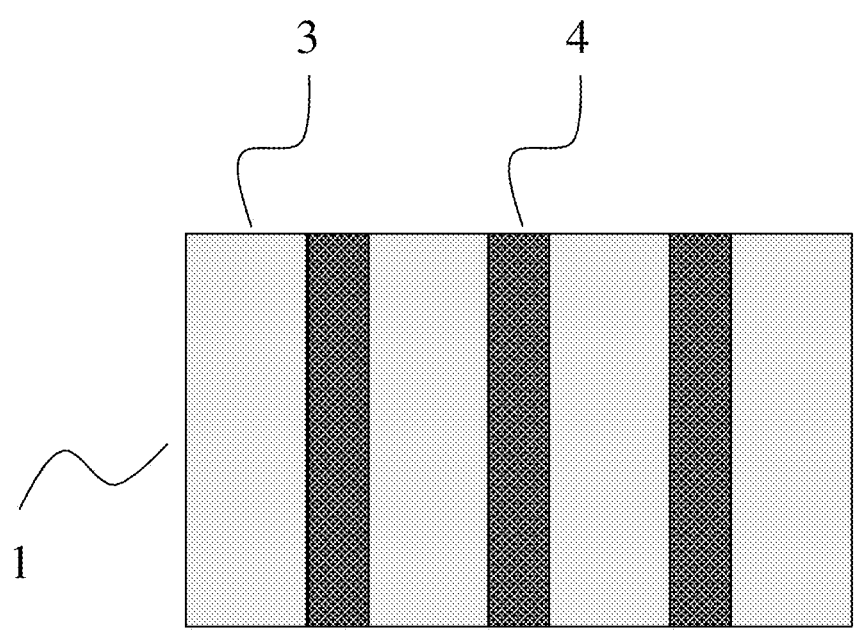

FIG. 1 shows a cross-section of the structure of a layer structure 1 according to the invention, for example an antistatic film, in general form. On a substrate 2 a coating is applied which encompasses areas 3 with a surface resistance R and areas 4 with a surface resistance at least 10 times greater than R. FIG. 2 shows the same layer structure 1 from above.

TEST METHODS

Determining the Surface Resistance

The determination was carried out by means of a so called four-point probe measurement as described for instance in U.S. Pat. No. 6,943,571 B1. The values are given in $\Omega$/square.

Determining the Colour Values L, a and b and the Transmission

The measurement of the transmission spectra of the coated PET films is carried out on a Lambda 900 two-channel spectrophotometer from Perkin Elmer. The instrument is fitted with a 15-cm photometer sphere, measurements are carried out in the sphere, to ensure that no interferences of the scattered light are detected. So the here presented values for transmission include also the scattered light or to this end transmission is 1-absorption.

Spectra were recorded in the visible range of the spectra from 320 nm to 780 nm in 5 nm steps. There is no sample in the reference beam, so the spectra are recorded against air. First transmission of an uncoated substrate is measured as a reference, as a substrate Melinex 506 films with a film thickness of 175 µm are used. Subsequently the coated substrates were measured.

From the spectra, the standard colour value Y (brightness) of the sample was calculated according to DIN 5033, on the basis of a 10°-abserver and the light type D65. The internal transmission was calculated from the ration of brightness of the substrate with the coating (Y) to that without the coating ($Y_0$) as follows:

Internal transmission corresponds to $Y/Y_0 \times 100$ percent.

For the sake of convenience in the following transmission means the internal transmission.

Using the software WinCol Version 1.2 supplied by the instrument manufacturer the colour evaluation of the transmission spectra was done. Here the CIE tristimulus values (standard colour values) X, Y and Z of the transmission spectrum in the wavelength range 380 nm to 780 nm are calculated in accordance with ASTM 308-94a and DIN 503. From the standard colour values the CIELAB coordinates L*, a* and b* are calculated in accordance with ASTM 308-94a and DIN 5033.

EXAMPLES

Example 1

Silver nanowires (AgNW) were synthesized using the polyol synthesis as described for example in WO-A-2012/022332. 50 g of the obtained mixture were mixed with 130 mL of acetone. The mixture was stirred for 30 min The supernatant solution was discarded and a precipitate is obtained.

The precipitate was mixed with 20 g of water and shaken. The mixture is then centrifuged (2500 rpm/20 min) The supernatant is again discarded. The mixing with water, shaking, centrifugation and sedimentation is repeated four times.

Example 2

Formulation Clevios PH 1000 with silver nanowires for transparent conductive coatings are prepared. 2.77 g silver nanowires (2.7% silver content gravimetrically, 75 mg silver) were mixed with 5.71 g of water, 7.85 g Clevios PH 1000 (86 mg PEDOT/PSS, Heraeus Precious Metals GmbH & Co. K G, Leverkusen), 0.755 g dimethylsulfoxide (DMSO, ACS reagent, Sigma Aldrich, Munich) and 50 µL Triton X100 (Sigma Aldrich, Munich). The formulation was coated on Melinex 506 films (Pütz GmbH+Co. Folien K G. Taunusstein) using a 6 µm wet-film thickness doctor blade (Erichsen K Hand Coater 620). Coatings were dried for 5 min at 120° C.

Example 3

Coated films from Example 2 were cut into pieces measuring approximately 5×10 cm. The lower half of the stripes were dipped into different water based etching solutions for 2 min, subsequently rinsed in a water bath for 1 min and dried for 5 min at 120° C. The surface resistivity was measured before and after treatment by the four-point probe technique. The results are summarized in Table 1.

TABLE 1

Etching results

| Etchant | Surface resistance Untreated [$\Omega$/square] | Surface resistance after treatment [$\Omega$/square] |
| --- | --- | --- |
| Water | 84 | 102 |
| $KMnO_4$ [1%] | 88 | n.d. |
| $KMnO_4$ [0.1%] | 79 | 5663 |
| $KMnO_4$ [0.01%] | 86 | 1595 |
| $HNO_3$ [10%] | 95 | 109 |
| $CuCl_2$ [7%] | 91 | 834 |
| $H_2O_2$ [10%] | 113 | 1100 |
| Dichloroisocyanuric acid [10%] | 91 | n.d. | n.d. non detectable (>1 × $10^8$ $\Omega$/square)

The color coordinates in the L*a*b coordinates system were determined on the etched and untreated pieces of the films. The differences ($\Delta$L, $\Delta$a* and $\Delta$b*) are shown in table 2.

TABLE 2

L*a*b values

| Etchant | $\Delta$L* | $\Delta$a* | $\Delta$b* |
| --- | --- | --- | --- |
| Water | 0.05 | 0 | 0.03 |
| $KMnO_4$ [1%] | 2.45 | 0.74 | 2.72 |
| $KMnO_4$ [0.1%] | 1.44 | 0.4 | 1.8 |
| $KMnO_4$ [0.01%] | 1.03 | 0.32 | 1.31 |
| $HNO_3$ [10%] | 0.1 | 0 | 0.07 |
| $CuCl_2$ [7%] | 0.16 | 0.1 | 0.29 |
| $H_2O_2$ [10%] | 0.34 | 0.1 | 0.26 |

TABLE 2-continued

L*a*b values

| Etchant | ΔL* | Δa* | Δb* |
|---|---|---|---|
| Dichloroisocyanuric acid [10%] | 0.21 | 0.18 | 0.05 |

Furthermore, the transmission (Y D65/10° value) of the etched and untreated pieces of the films was measured. The results are shown in table 3.

TABLE 3 transmission

| Etchant | transmission untreated | transmission after treatment |
|---|---|---|
| Water | 97.7 | 97.6 |
| KMnO$_4$ [1%] | 97.15 | 91.07 |
| KMnO$_4$ [0.1%] | 97.32 | 93.49 |
| KMnO$_4$ [0.01%] | 97.61 | 94.73 |
| HNO$_3$ [10%] | 97.3 | 97.5 |
| CuCl$_2$ [7%] | 97.3 | 97.6 |
| H$_2$O$_2$ [10%] | 97.4 | 98.3 |
| Dichloroisocyanuric acid [10%] | 97.4 | 97.9 |

As can be seen from the results shown in tables 1, 2 and 3, using organic compound capable of releasing chlorine, such as Dichloroisocyanuric acid, for etching conductive layers containing silver nanowires leads to a remarkable reduction of the surface resistance (see table 1) without significantly affecting the optical properties of the etched areas (see tables 2 and 3). Using the etching compounds of the prior art for etching conductive layers comprising silver nanowires, such as CuCl$_2$, HNO$_3$, H$_2$O$_2$ or KMnO$_4$, either leads to a significant deterioration of the optical properties (as can be seen for KMnO$_4$ in tables 2 and 3) or to a comparatively low reduction of the surface resistance (as can be seen for CuCl$_2$, HNO$_3$ and H$_2$O$_2$ in table 1).

Example 4

Films that have been etched with a 10% solution of dichloroisocyanuric acid were stored in a climate cabinet at 85° C. and 85% humidity for 2 or 4 days and the surface resistivity was measured again. For all samples the surface resistivity of the etched part was not detectable (>1×10$^8$ Ω/square).

The invention claimed is:
1. A method for producing a layer structure, comprising the process steps:
   i) coating a substrate with a composition comprising silver nanowires, a sulfonated polymer, a conductive polymer and a solvent,
wherein the conductive polymer is a polythiophene;
   ii) partially removing the solvent, thereby obtaining a substrate that is coated with an electrically conductive layer, the electrically conductive layer comprising the silver nanowires, the sulfonated polymer and the conductive polymer; and
   iii) bringing into contact selected areas of the electrically conductive layer with an etching composition, thereby reducing the conductivity of the electrically conductive layer in these selected areas, wherein the etching composition comprises an organic compound capable of releasing chlorine, bromine or iodine, a compound containing hypochloride, a compound containing hypobromide or a mixture of at least two of these compounds;
wherein the surface resistance of the selected areas that have been brought into contact with the etching composition in step iii) is at least 10 times greater than the surface resistance of the layer provided in process step ii); and
wherein the color difference (ΔE) between the selected areas that have been brought into contact with the etching composition in step iii) and the electrically conductive layer provided in step ii) is at most 4.5.

2. The method according to claim 1, wherein the silver nanowires in the composition used in process step i) have a length of from 1 μm to 200 μm, a diameter of from 20 nm to 1,300 nm and an aspect ratio (length/diameter) of at least 5.

3. The method according to claim 1, wherein the silver nanowires in the composition used in process step i) are obtained by a process comprising the process steps:
   a) providing a reaction mixture comprising
       a polyol,
       an organic chemical which is adsorbed on to a silver surface,
       a chemical which forms a halide and/or one which forms a pseudohalide, wherein the chemical which forms a halide is a salt of one of the halides Cl$^-$, Br$^-$ and/or I$^-$ and wherein the chemical which forms a pseudohalide is a salt of one of the pseudohalides SCN$^-$, CN$^-$, OCN$^-$ and/or CNO$^-$,
       a chemical which forms a redox pair, chosen from the group consisting of bromine, iodine, vanadium and mixtures thereof, and
       a silver salt, and
   b) heating the reaction mixture to a temperature of at least 100° C.

4. The method according to claim 1, wherein the sulfonated polymer in the composition used in process step i) is polystyrene sulfonic acid (PSS).

5. The method according to claim 1, wherein the conductive polymer is present in the form of a complex formed from the polythiophene and the sulfonated polymer.

6. The method according to claim 5, wherein the conductive polymer is poly(3,4-ethylenedioxythiophene) (PEDOT) and is present in the form of a PEDOT/PSS-complex.

7. The method according to claim 1, wherein the organic compound capable of releasing chlorine, bromine or iodine comprises at least one structural element (II)

wherein
    Hal is a halogen selected from the group consisting of chlorine, bromine and iodine,
    Y is selected from N, S and P, and
    X$_1$ and X$_2$ can be the same or different and each denote respectively a halogen, a carbon atom or a sulphur atom, and wherein one or more further atoms can optionally be bonded to X$_1$ and X$_2$.

8. The method according to claim 7, wherein the organic compound capable of releasing chlorine or bromine comprises at least two structural elements (II) in which Hal denotes a chlorine atom or a bromine atom and Y denotes nitrogen, wherein the at least two structural elements (II) can optionally be different from one another.

9. The method according to claim 8, wherein the organic compound capable of releasing chlorine or bromine comprises the structural element (III)

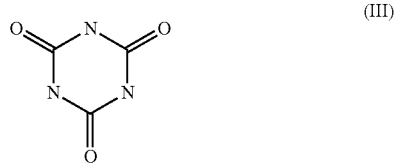
(III)

in which a chlorine atom or a bromine atom is bonded to at least two of the nitrogen atoms.

10. The method according to claim 9, wherein the organic compound capable of releasing chlorine or bromine is sodium dichloroisocyanurate, sodium dibromoisocyanurate, tribromoisocyanuric acid or trichloroisocyanuric acid.

11. The method according to claim 1, wherein the etching composition used in process step iii) comprises the organic compound capable of releasing chlorine, bromine or iodine, the compound containing hypochloride, the compound containing hypobromide or the mixture of at least two of these compounds in a concentration in a range from 0.01 to 50 wt.-%, relative to the total weight of the etching composition.

12. The method according to claim 1, wherein the bringing into contact of the electrically conductive layer with the etching composition is performed by dipping the electrically conductive layer into the etching composition or by printing the electrically conductive layer with the etching composition.

13. The method according to claim 1, wherein the method comprises as a further process step:

iv) washing the electrically conductive layer brought into contact with the etching composition.

14. The method of claim 1, wherein step iii) is performed without affecting the optical appearance of the selected areas.

15. The method of claim 1, wherein the surface resistance of the selected areas that have been brought into contact with the etching composition in step iii) is at least 100 times greater than the surface resistance of the layer provided in process step ii).

16. The method of claim 1, wherein the surface resistance of the selected areas that have been brought into contact with the etching composition in step iii) is at least 1,000 times greater than the surface resistance of the layer provided in process step ii).

17. The method of claim 1, wherein the surface resistance of the selected areas that have been brought into contact with the etching composition in step iii) is at least 10,000 times greater than the surface resistance of the layer provided in process step ii).

18. The method of claim 1, wherein the surface resistance of the selected areas that have been brought into contact with the etching composition in step iii) is at least 100,000 times greater than the surface resistance of the layer provided in process step ii).

19. The method of claim 1, wherein the color difference ($\Delta E$) between the selected areas that have been brought into contact with the etching composition in step iii) and the electrically conductive layer provided in step ii) is at most 3.0.

20. The method of claim 1, wherein the color difference ($\Delta E$) between the selected areas that have been brought into contact with the etching composition in step iii) and the electrically conductive layer provided in step ii) is at most 1.5.

* * * * *